(12) United States Patent
Freeman et al.

(10) Patent No.: US 6,572,702 B1
(45) Date of Patent: Jun. 3, 2003

(54) HIGH SPEED ELECTRONIC ASSEMBLY SYSTEM AND METHOD

(75) Inventors: Gary T. Freeman, Beverly, MA (US); Ronald C. Lasky, Medway, MA (US); Robert J. Balog, Wrentham, MA (US); Joseph Belmonte, Norwood, MA (US); Thomas C. Prentice, Westford, MA (US); Brian P. Prescott, Fremont, NH (US)

(73) Assignee: Speedline Technologies, Inc., Franklin, MA (US)

( * ) Notice: Subject to any disclaimer, the term of this patent is extended or adjusted under 35 U.S.C. 154(b) by 86 days.

(21) Appl. No.: 09/745,324

(22) Filed: Dec. 21, 2000

Related U.S. Application Data

(60) Provisional application No. 60/172,908, filed on Dec. 21, 1999.

(51) Int. Cl.[7] ............................ B05C 11/00; B05C 13/02
(52) U.S. Cl. ........................ 118/66; 118/313; 118/324
(58) Field of Search ........................... 118/66, 67, 313, 118/324, 301, 239, 630, 206

(56) References Cited

U.S. PATENT DOCUMENTS 4,568,406 A * 2/1986 Kieran et al. ............... 156/355
5,321,885 A * 6/1994 Hino et al. .................. 29/832
5,560,533 A   10/1996 Maenishi ..................... 228/8
5,743,962 A * 4/1998 Ogasawara et al. ......... 118/643

FOREIGN PATENT DOCUMENTS

JP            6-252546           9/1994

* cited by examiner

Primary Examiner—Richard Crispino
Assistant Examiner—Yewebdar T. Tadesse
(74) Attorney, Agent, or Firm—Mintz, Levin, Cohn, Ferris, Glovsky and Popeo, P.C.

(57) ABSTRACT

Aspects of the present invention are directed to methods and apparatus for producing substrates, including printed circuit boards, in production lines. In one aspect, the present invention provides a production system, a plurality of production lines, wherein machines from one of the lines may be used to replace machines in one of the other lines. In another aspect, the present invention provides a printing system for use in circuit board production lines. The printing system includes a first printer, a second printer and a transfer station. In another aspect, the present invention provides a dispensing system for use is production lines. The dispensing system includes a shuttle conveyor system that allows parallel processing on multiple circuit boards.

8 Claims, 10 Drawing Sheets

HIGH SPEED ELECTRONIC ASSEMBLY SYSTEM AND METHOD

RELATED APPLICATIONS

This application claims priority under 35 U.S.C. §119(e) to U.S. provisional patent application Ser. No. 60/172,908, filed on Dec. 21, 1999, which is incorporated herein by reference.

FIELD OF THE INVENTION

The present invention relates generally to methods and apparatus for providing high speed electronic assembly, and more particularly to improved methods and apparatus for manufacturing printed circuit boards.

BACKGROUND OF THE INVENTION

A typical electronic circuit board manufacturing process involves a number of operations, each of which is performed by an independent machine. These operations typically include stenciling a pattern of solder onto the pads of an incoming circuit board, placing electrical components on the pads of the board and heating the board to establish the integrity of the contact between the solder, the board and the components. Depending on the particular application, the manufacturing operation may also include other operations, such as dispensing encapsulents or adhesives, curing the encapsulents or adhesives, and optically inspecting completed or partially completed boards. The manufacturing operations are typically done in a serial production line in which the machines for each process are coupled together using conveyors for transporting partially completed boards from one machine to the next.

FIG. 1 shows a block diagram of a typical electronic circuit board production line 10. The circuit board production line includes a printer 12, a component placement machine 14, an automated optical inspection system 16, a dispenser 18, an oven 20, and an automated board handling system 22 between each of the machines. The printer 12 is used to stencil solder paste onto boards. The component placement machine 14 is used to place electrical components on the circuit boards. The dispenser 18 may be used to perform a number of functions such as the deposition of underfill material around and under components placed on the boards. The optical inspection system 16 is used to inspect the boards in the line. Additional inspection systems may be added to the line, or incorporated in the machines of the line, to ensure that production quality standards are met. The oven 20 is used to reflow the solder paste printed by the printer. A separate oven may be used to cure adhesives and encapsulents deposited by the dispenser 18. For some board production applications, additional machines may be added to the production line and/or some of the machines shown in FIG. 1 may not be included.

Because of the cost and availability of manufacturing floor space, and because of ever tightening quality requirements there is a need for higher speed more reliable circuit board manufacturing production lines. To maintain high speed output from production lines, it is desirable to have minimum downtime of the lines. Accordingly, it is typically required that machines used in circuit board production lines have high reliability requirements and low mean time to repair requirements. These requirements often lead to the machines becoming more expensive than desirable.

SUMMARY OF THE INVENTION

Embodiments of the present invention provide improved processes and apparatus for producing electronic circuit boards and other substrates.

A first aspect of the present invention is directed to a production system for producing completed substrates from raw substrates. The production system includes a first production line having an input to receive raw substrates, an output that provides completed substrates and a plurality of machines, coupled in series and arranged substantially along a first axis. The production system further includes a second production line having an input to receive raw substrates and an output that provides completed substrates. The second production line includes a plurality of machines, coupled in series and arranged along a second axis that is substantially parallel to the first axis. In addition, the production system includes a set of spare machines disposed along a third axis that is substantially parallel to the first axis and the second axis, the third axis being disposed between the first axis and the second axis. Each machine of the spare machines is similar to, and may function as a replacement for, at least one of the machines in the first production line and is similar to, and may function as a replacement for, one of the machines of the second production line.

The completed substrates may be circuit boards having components disposed thereon. The set of spare machines may be configured as a third production line having an input to receive raw substrates and an output that provides completed substrates. The first production line may include a first printer, a second printer and a transfer station. At least the first production line may include a first dispensing machine having an input, an output, and a shuttle conveyor system, wherein the shuttle conveyor system includes movable conveyor segments that allow a second circuit board to be moved from the input of the first dispensing machine to the output of the first dispensing machine while material is dispensed on a first circuit board in the first dispensing machine. Further, at least the first production system may include a second dispensing machine disposed after the first dispensing machine in the first production system, the second dispensing machine having an input, an output, and a shuttle conveyor system, wherein the shuttle conveyor system includes movable segments that allow the first circuit board to be moved from the input of the second dispensing machine to the output of the second dispensing machine while material is dispensed on the second circuit board in the second dispensing machine.

In another aspect of the present invention, a method of manufacturing completed substrates from raw substrates in a production system having a first production line and a second production line is provided. The method includes providing a spare set of machines disposed on a production floor between the first production line and the second production line, detecting a failed machine in one of the first production line and the second production line, and replacing the failed machine with a machine from the spare set of machines.

The method may further include steps of arranging the spare set of machines as a production line and producing completed substrates using the first production line, the second production line and the third production line. At least the first production line may include a dispensing machine, and the method may further includes steps of loading a first substrate into the dispensing machine, moving the first substrate to a dispensing position in the dispensing machine, dispensing material onto the first substrate, loading a second substrate into the dispensing machine and unloading the second substrate from the dispensing machine while the first substrate is at the dispensing position.

In yet another aspect, a printing system for use in a production line that produces completed substrates is provided. The printing system includes a first printer that prints material onto a substrate, the first printer having an input to receive raw circuit boards and an output that provides circuit boards having material printed thereon, a second printer that prints material onto a substrate, the second printer having an input to receive raw circuit boards and an output that provides circuit boards having material printed thereon, and a transfer station having a first input, a second input and an output, wherein the first input is coupled to the output of the first printer to receive circuit boards, the second input is coupled to the output of the second printer to receive circuit boards, and the output provides circuit boards. The transfer station may be configured to alternately provide at its output circuit boards from the first printer and circuit boards from the second printer.

Still another aspect of the present invention provides a dispensing system for dispensing material onto substrates. The dispensing system includes an input to receive substrates, an output that provides substrates, a dispensing head that dispenses material onto substrates, and means for moving a second substrate from the input to the output while the first substrate is disposed beneath the dispensing head and material is being dispensed on the first substrate.

The means for moving may include a shuttle conveyor system. The shuttle conveyor system may include an input conveyor segment coupled to the input and configured to convey substrates in a first direction along a first axis, an output conveyor segment coupled to the output and configured to convey substrates in the first direction along the first axis, a center conveyor segment having a front segment and a back segment, each of the front segment and the back segment being configured to convey substrates in the first direction along the first axis, and each of the front segment and the back segment being movable along a second axis, normal to the first axis, to align one of the front segment and the back segment with the input conveyor segment and the output conveyor segment. The dispensing system may further include a front dispensing location and a back dispensing location, wherein the front segment is movable between a center location aligned with the input conveyor segment and the front dispensing location, and wherein the back segment is movable between the center location and the back dispensing location. In addition, the dispensing system may further include a gantry system coupled to the dispensing head that moves the dispensing head over substrates disposed on the front dispensing location and over substrates disposed on the back dispensing location. dr

BRIEF DESCRIPTION OF THE DRAWINGS

For a better understanding of the present invention, reference is made to the drawings which are incorporated herein by reference and in which.

DETAILED DESCRIPTION

Illustrative embodiments of the present invention described below are directed to improved processes and apparatus for producing electronic circuit boards. However, as understood by those skilled in the art, embodiments of the present invention are not limited to the production of electronic circuit boards, but rather, may be implemented in the production of other products including, but not limited to, electronic components, semiconductor devices, and industrial products.

Figure 1:
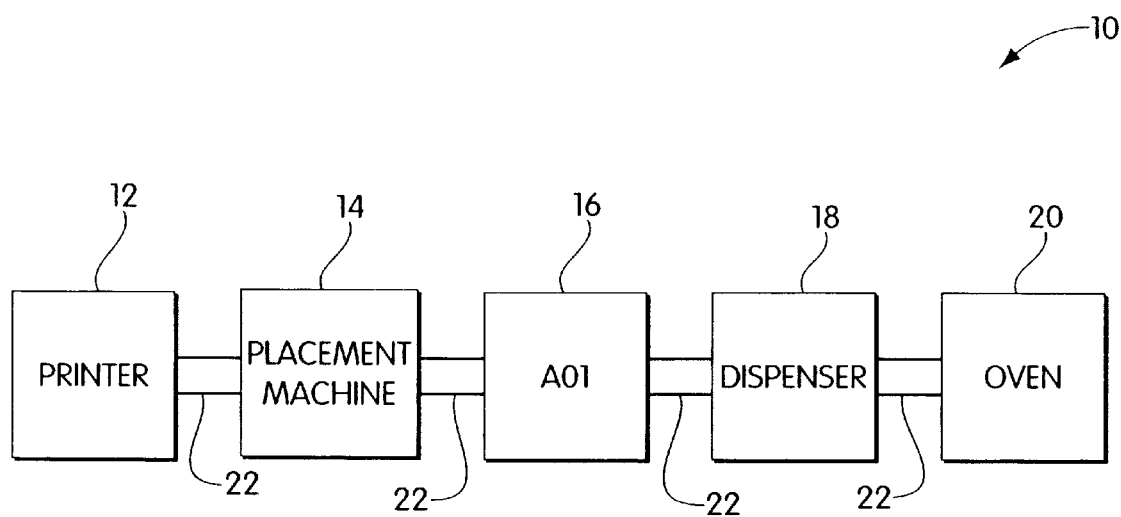
FIG. 1 is a block diagram of a prior art printed circuit board production line.
Figure 2:
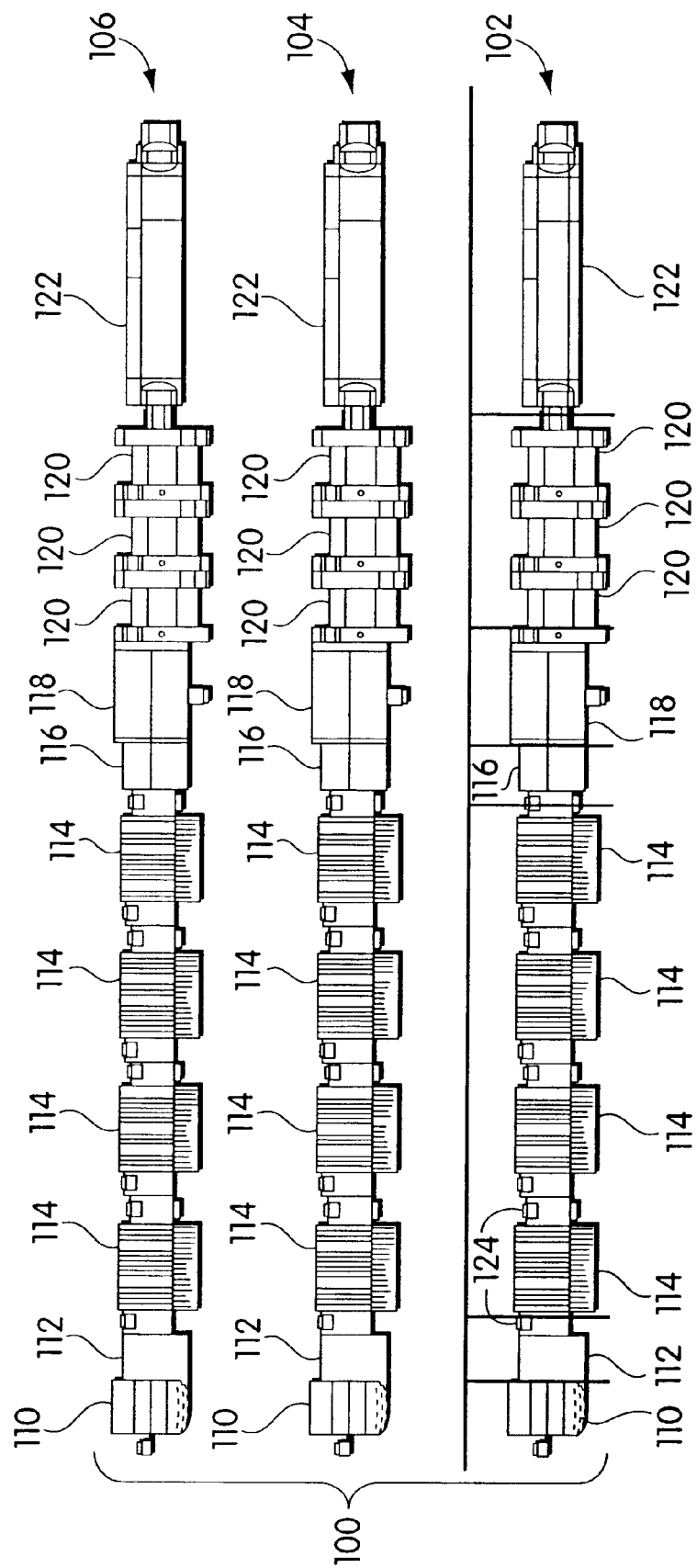
FIG. 2 is a diagram of a printed circuit board production line in accordance with one embodiment of the present invention.

FIG. 2 shows an electronic circuit board production system 100 in accordance with one embodiment of the present invention. The production system 100 includes three identical production lines 102, 104 and 106. Each production line includes a printer 110, an SPPC 112, chip shooters 114, an automated optical inspection system 116, a dispensing system 118, three placement machines 120 and an oven 122. In addition, each of the production lines includes a board handling system 124 for transporting boards between the machines. The individual machines of the production lines may be implemented using standard machines known in the art, or may be implemented using a combination of standard machines and improved machines that are described below. As understood by those skilled in the art, some of the machines contained in the production lines may be removed and/or additional machines added depending on the particular boards being manufactured.

In one embodiment of the present invention, an optimal method for operating the production system 100 of FIG. 2 is provided to ensure that a minimum production requirement of circuit boards may be maintained. The rate at which a particular production line can produce boards is dependent on a number of factors including the complexity of the boards and the number of operations that must be performed on the boards. For some production lines, an additional number of a type of machine may be added to the line to increase the production rate. For example, in the production line 102, four chip shooters are used to place components on the boards. The use of four chip shooters allows the operation of placing components to be shared by four machines.

In embodiments of the present invention that use the production system 100, each of the production lines 102, 104 and 106 is designed so that the combined production rate is equal to or greater than the desired production. The use of three production lines operating in parallel results in a high combined production rate with high reliability. The close proximity of the production lines also allows a reduction in the total number of operators and also provides added redundancy by allowing machines to be swapped between lines to prevent more than one line from being down at a time. For example, if the dispensing machine 118 of line 102 failed at the same time that the printer 110 of line 102 failed, the dispensing machine 118 of line 104 could be moved into line 102 while the dispensing machine of line 102 was pulled out for repair. This would allow lines 102 and 106 to continue operation while the repairs are being made.

Figure 3:
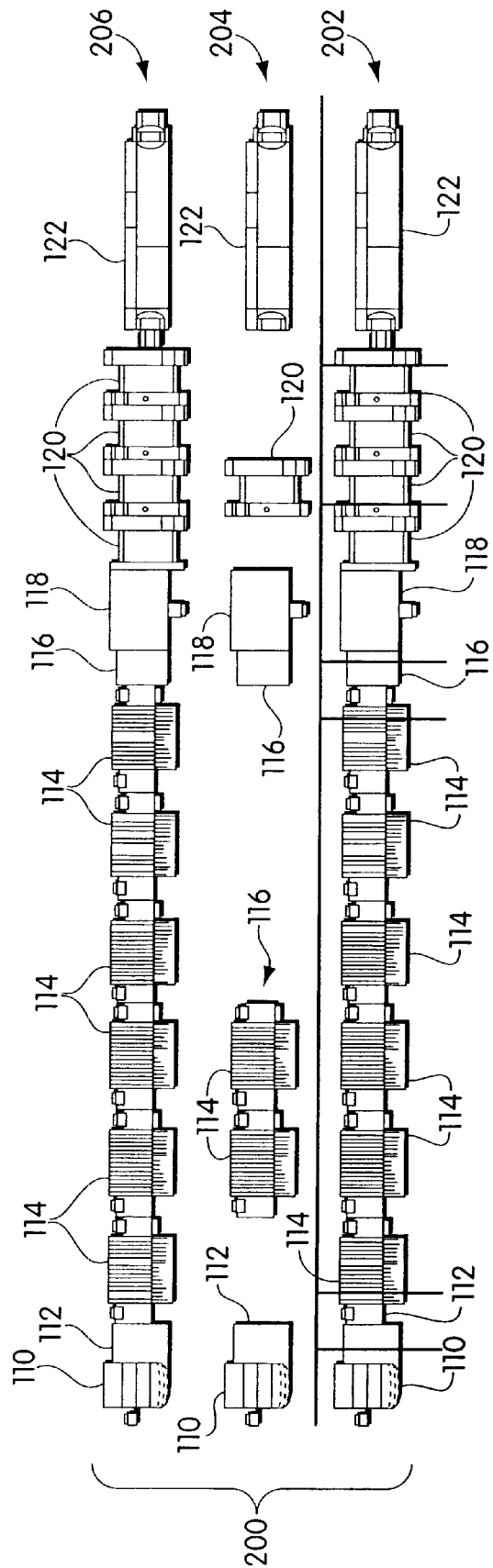
FIG. 3 is a diagram of a printed circuit board production line in accordance with another embodiment of the present invention.

FIG. 3 shows a production system 200 in accordance with another embodiment of the present invention. Production system 200 includes production lines 202 and 206 having machines similar to those of production lines 102, 104 and 106 described above. In addition, production system 200 includes a row 204 that includes a set of spare equipment. The spare set of equipment includes a printer 112, two chip shooters 114, an optical inspection machine 116, a dispenser 118, a placement machine 120, and an oven 122. Depending on the output requirements of the production system 200, more or less spare machines may be included in the spare set of equipment.

Production system 200 is designed to allow one of the spare machines to be moved in place of a failed machine in either production line 202 or 206 to maintain production lines 202 and 206 in operation. To reduce the time required to replace a failed machine, each of the machines in the production lines is mounted in a machine docking cradle that is permanently mounted to the factory floor and contains all of the machine power, nitrogen, air and communication ports allowing fast replacement of a failed machine with a spare machine. In addition, each of the machines have built in wheels to allow the machines to be moved in and out of the cradles. As understood by one skilled in the art the machines of production system 100 may also be contained in cradles to allow quick swapping of machines between production lines.

The production system 200 is able to use less factory floor space than production system 100. With production system 100, aisles are provided to allow access to the front and back of each of the machines of all three production lines. With production system 200, there is less space required for access to the spare machines in row 204, since these machines are not operational. Further, the machines in row 204 may be moved to provide access to machines in lines 202 and 206.

In embodiments of the present invention, the production systems 100 and 200 may be controlled and monitored using the GEM/SECS2 protocol. Each of the machines can be linked using the protocol to provide real time monitoring of machine cycle time, process quality and machine subsystem diagnostics. The monitoring of machine subsystem diagnostics may allow detection of an impending failure, and replacement of a machine with a redundant machine prior to the failure actually occurring to reduce production line down time.

The individual machines used in embodiments of the present invention will now be described in greater detail. As described below, a number different alternatives are available for the machines depending on the requirements of the production lines. The printer 110 is a high volume printer that prints solder paste onto the circuit boards. In one embodiment, the printer may be implemented using a dual track printer, such as those available from Speedline Technologies, Inc. of Franklin, Mass., and described in U.S. Pat. No. 5,873,939, issued Feb. 23, 1999, and U.S. Pat. No. 6,066,206, issued May 23, 2000, both of which are incorporated herein by reference. The use of dual tracks allows one board to be loaded and aligned in the printer while printing occurs on a second board in the printer. The printer 112 may also include a conveyor system that provides staging of boards into and out of the printer, such as that described in U.S. Pat. No. 6,032,577, which is incorporated herein by reference.

In another embodiment, the printer 110 may be implemented using a drum printer, such as that described in U.S. patent application Ser. No. 09/706,966, filed on Nov. 6, 2000, and incorporated herein by reference. The drum printer utilizes a rotating drum to dispense material through a stencil onto the circuit boards. In still other embodiments, the printer may be implemented using one of a number of other standard printers, such as those available by Speedline Technologies, Inc.

Figure 4:
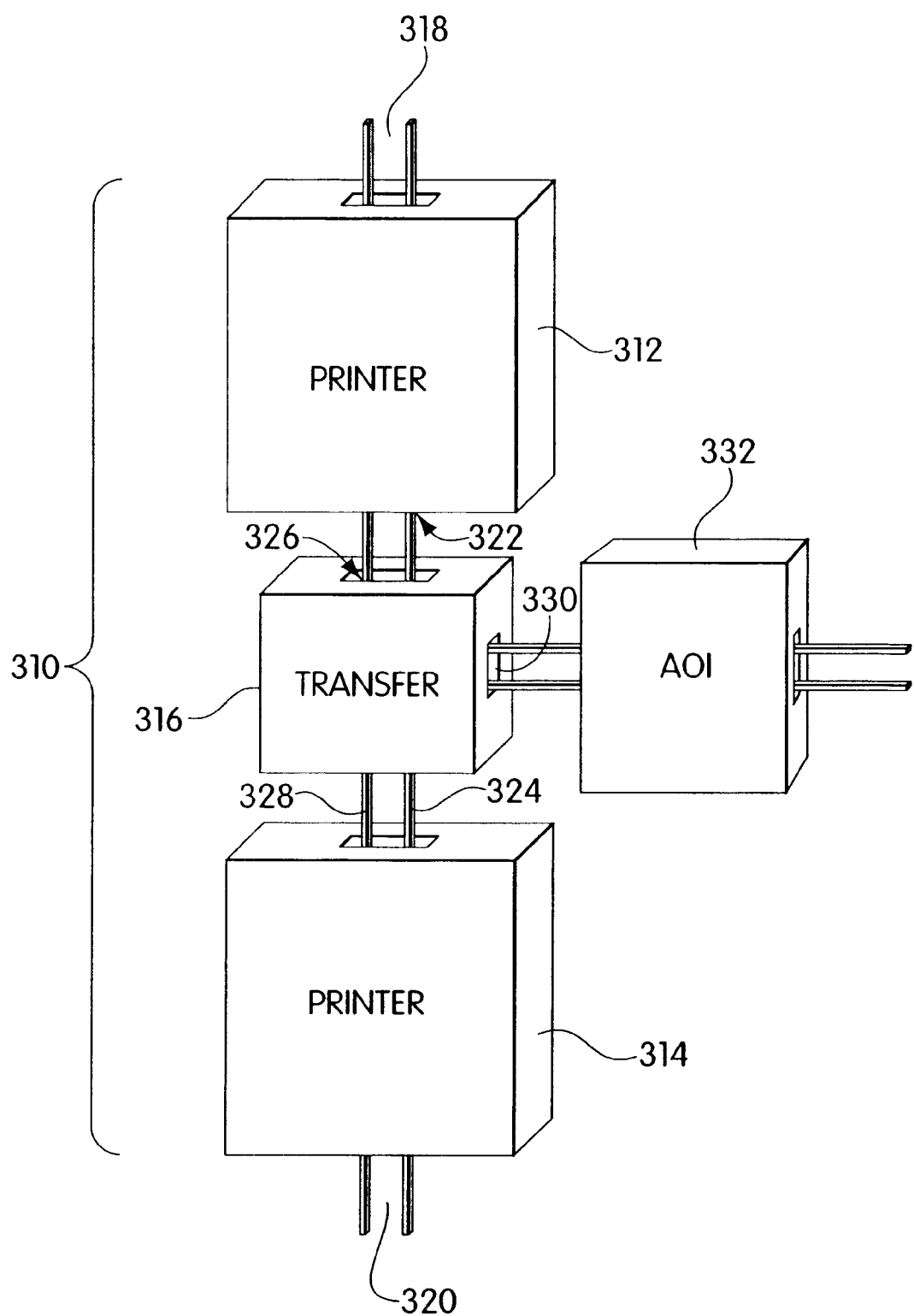
FIG. 4 is a diagram of a printing system used in embodiments of the present invention.
Figure 5:
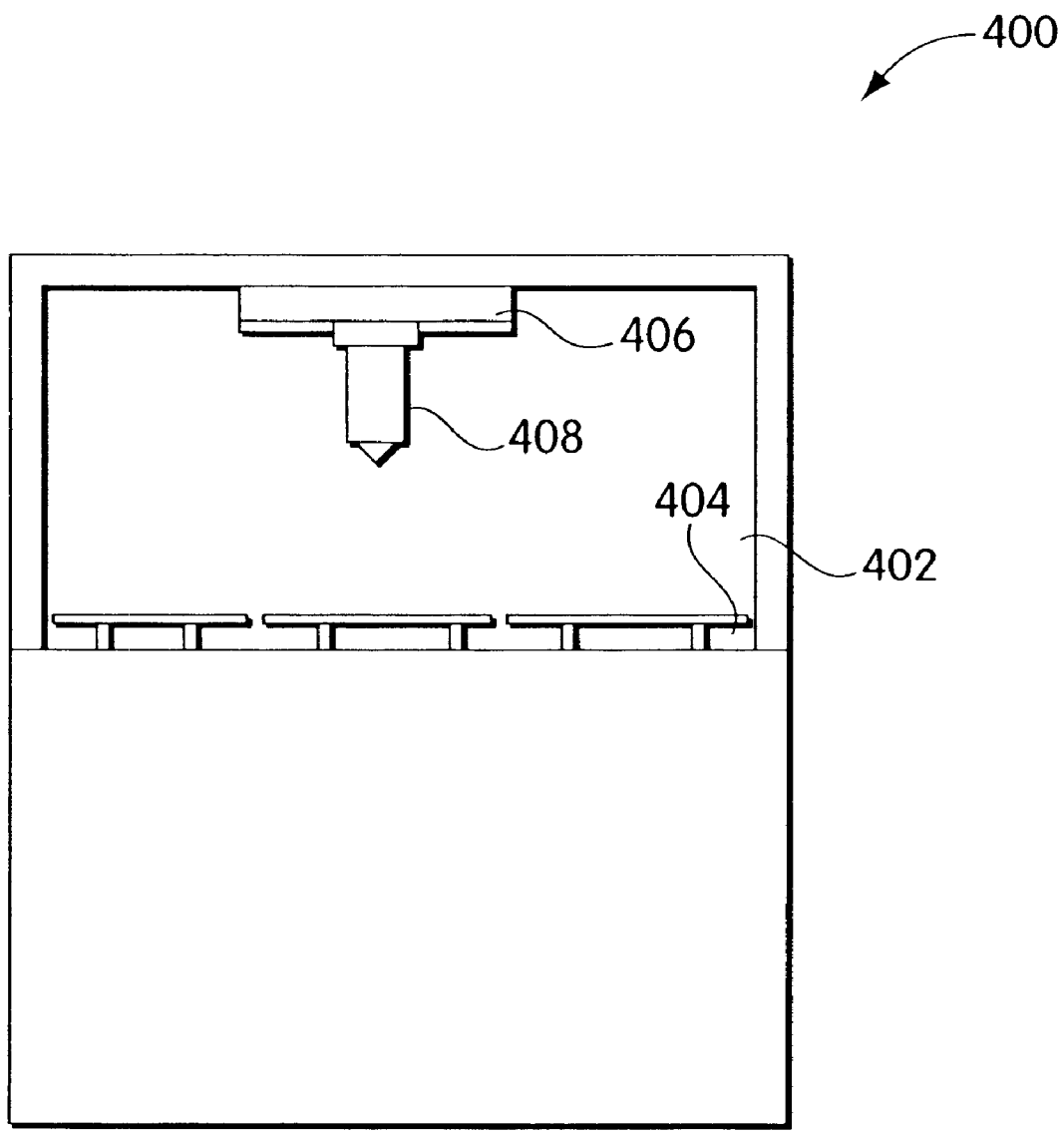
FIG. 5 is a diagram of a dispensing system used in embodiments of the present invention.

In still another embodiment, the printer in the production lines may be implemented using printing system 310 having two printers 312 and 314 connected in a "T" configuration with a transfer station 316, as shown in FIG. 4. Each of printers 312 and 314 has an input 318 and 320 for receiving boards and an output 322 and 324 for providing boards that have been printed with solder paste. The transfer station 316 has inputs 326 and 328 for receiving the boards from the printers and a single output 330 for providing boards to the next machine in the line. The next machine may be an automated optical inspection (AOI) machine 332, as shown in FIG. 4, or the next machine may be an SPPC 112 as in the production lines 102, 104 and 106.

The printers 312 and 314 may be one of a number of printers including the drum printer, dual lane printer and other printers described above. The transfer station may be implemented using one of a number of diverters, known in the art. In one embodiment, the printing system 310 operates with the printers 180 degrees out of phase with respect to each other, so that the printers alternate feeding boards to the transfer station. This method of operation reduces the cycle time of the printing system by half compared to a single printer.

The printing system 310 provides several advantages over one single lane printer and over one dual lane printer. As discussed above, the cycle time is reduced by half compared to one single lane printer. In addition, unlike the dual-lane printer, the use of two printers provides a complete fault tolerant system to provide 50% throughput even if one of the printers has failed. Further, 50% throughput can be maintained while maintenance is performed on one of the printers. The printing system is also highly flexible as the printers can be oriented in configurations other than a "T" depending on the factory footprint available. For example, the printers can be arranged side be side followed by the transfer station rather than in a "T" configuration. Either one or both of the printers in the system can be replaced by a dual-lane printer for use in a dual-lane production line.

The SPPC machine 112 is located in the production lines after the printer 110. The SPPC, in conjunction with monitoring components contained within each machine, is used to monitor the process of the production lines. Information from the SPPC and each of the machines is networked using the GEM/SECS protocol. The SPPC machine may be implemented using an automated optical inspection machine, similar to the AOI machine 116. As understood by those skilled in the art, the SPPC is an optional machine for the production line, and the placement of the SPPC machine in a line may be different depending on particular requirements of the line. Also, additional SPPC or AOI machines may be included in production lines of embodiments of the present invention.

The chip shooters 116 are used to place components on the circuit boards. In the production lines shown in embodiments of the present invention, either three or four chip shooters are included in each line. Depending on the particular requirements for a circuit board manufacturing process, more or less chip shooters may be used. Chip shooters are well known to those in the art and are available from a number of suppliers including Fuji and Siemens.

The Automated Optical Inspection (AOI) machine 116 is used to inspect the circuit boards in the line. To provide further monitoring of the manufacturing process, additional AOI machines may be used in product lines of the present invention.

The dispensing machine 118 is used to dispense materials such as encapsulents, adhesives and underfills onto the circuit boards. The particular materials dispensed depend on the specific requirements of the circuit boards being assembled. In one embodiment, a flux/underfill material available from Alpha-Frye of Jersey City, N.J., and sold under the name STAYCHIP™ is dispensed by the dispensing machine 118. This flux/underfill material is applied on a board prior to chip placement. After the chip is placed, the flux/underfill is cured in a refow oven after first acting as a flux. The use of the flux/underfill material eliminates the need for capillary underfill and curing processes.

In one embodiment of the present invention, the dispensing machine 118 is implemented using a four head dispensing machine sold under the name XYFLEX® by Speedline Technologies, Inc. of Franklin, Mass. In other embodiments, the dispensing machine may be implemented using other single head machines available from Speedline Technologies, Inc. including the XYFLEXPRO™ dispensing machine.

In still other embodiments, the dispensing system may include a vacuum assisted pressurized system to underfill chip scale packages (CSP). One such vacuum assisted system is described in U.S. patent application Ser. No. 09/493,873, which is incorporated herein by reference.

The placement machines 118 are used to place additional components on the circuit boards. In one embodiment, the placement machines may be implemented using machines available from Fuji or Siemens.

The oven 120 is used to reflow solder paste printed on the circuit boards by the printer to electrically and mechanically couple components to the circuit boards. In other embodiments of production lines, additional ovens may be included to provide curing of materials dispensed by the dispenser 118. In one embodiment of the present invention, the oven is implemented using an Electrovert® Bravo® oven available from Speedline, Inc. of Franklin, Mass. The Electrovert Bravo oven has three panels across the oven with a shuttle conveyor to allow parallel processing of three circuit boards.

In another embodiment, the oven is implemented using an oven having dual stacked chambers within a single oven. Elevator shuttles are used in the oven to lift and index boards to and across each oven chamber. The shuttles place each board in an available chamber. After a board is processed through a chamber, it is unloaded to a downstream board handler in a similar manner to which it was loaded. Each of the stacked chambers has a complete chamber capable of performing the entire reflow process. After the boards are removed from the oven, the manufacturing process is complete.

In embodiments of the present invention described above, the production lines utilize typical dispensing systems known in the art. In typical dispensing machines, the conveying of parts into and out of a machine is a serial task. This serial task typically includes conveying a part into the dispensing machine, lifting and locking the part in place, dispensing material, lowering and unlocking the part, and conveying the part from the dispensing system. As part of the lifting and locking steps, vision alignment is typically used to align the part in the machine, and a z-height detection system is used to detect the height of the part at the locked position.

In other embodiments of the present invention, novel conveyor shuttle systems are used to increase the throughput rate of the dispensing machines by loading and unloading circuit boards in dispensing machines in parallel with the dispensing of materials on other circuit boards. A first version of a shuttle conveyor system of the present invention, is designed for use with a production line having at least two dispensing machines coupled in series in the line. As will now be described with reference to FIGS. 5 and 6a–6d, a dispensing machine 400 has a conveyor system 402 that allows a second circuit board to pass through the dispensing machine to a second dispensing machine, while dispensing is occurring on a first board in dispensing machine 400. In addition to the conveyor system 402, dispensing machine 400 includes a platform 404 on which the conveyor system is mounted, a gantry system 406 mounted above the platform, and a dispensing pump 408 mounted to the gantry system. The gantry system is controllable to move the pump across the platform to dispense on circuit boards and to lower the pump to proper dispense heights over circuit boards.

The conveyor system 402 has an infeed conveyor 410, a front central conveyor 412 a back central conveyor 414, and an outfeed conveyor 416. The direction of movement of circuit boards in the conveyor system 402 is indicated by arrow 418 in FIG. 6a. In a first embodiment of the conveyor system, the two central conveyors are slidably mounted to the platform to allow movement of the central conveyor in a direction perpendicular to the direction of movement of the boards to provide alignment of either front central conveyor 412 or back central conveyor 414 with the infeed conveyor 410 and the outfeed conveyor 416.

Figure 6A:
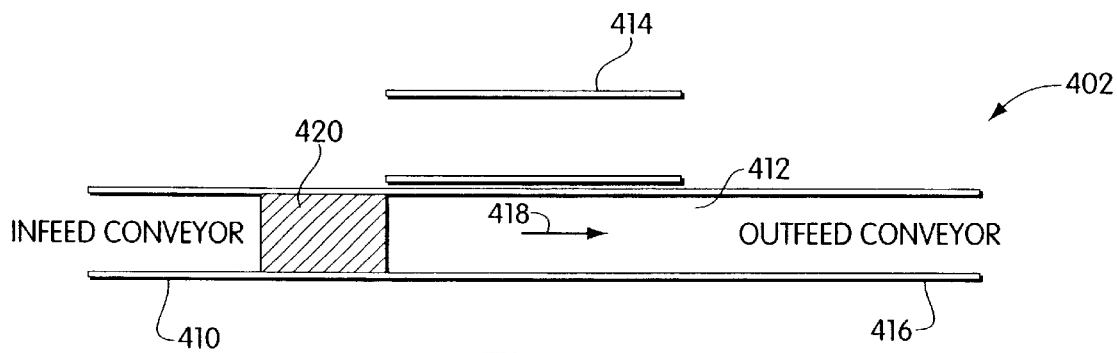
FIGS. 6a–6d are diagrams depicting the operation of a shuttle conveyor system in accordance with one embodiment of the present invention.

Operation of the conveyor system 402 will now be described. FIG. 6a shows conveyor system 402 in a load position for loading a first circuit board 420 into the dispensing machine. In the load position of FIG. 6a, the central conveyors 412 and 414 are in a back position with front central conveyor 412 aligned with the infeed conveyor 410 and the outfeed conveyor 416. Circuit board 420 is being moved from the infeed conveyor to front central conveyor 412.

Figure 6B:
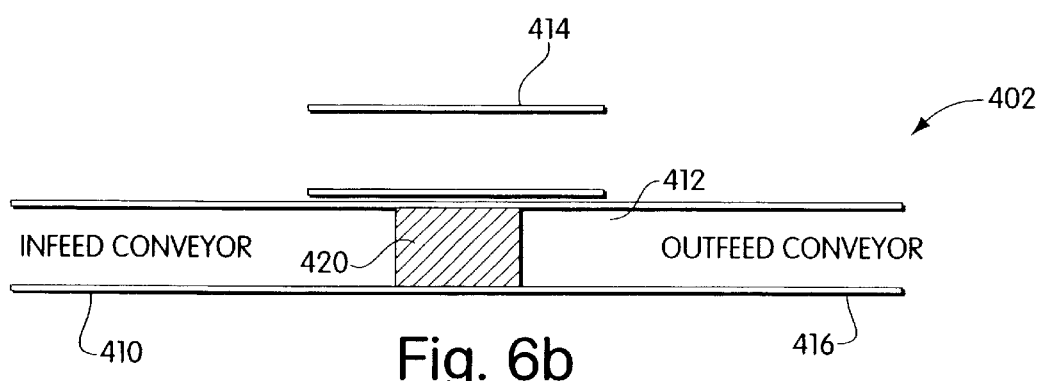
Figure 6C:
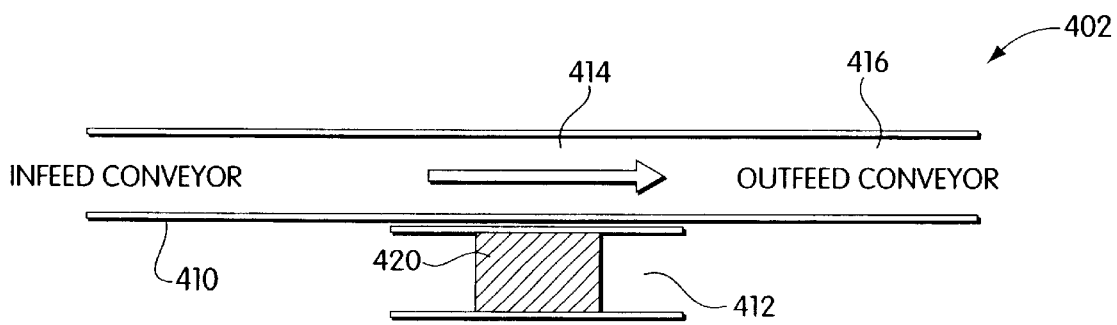
Figure 6D:
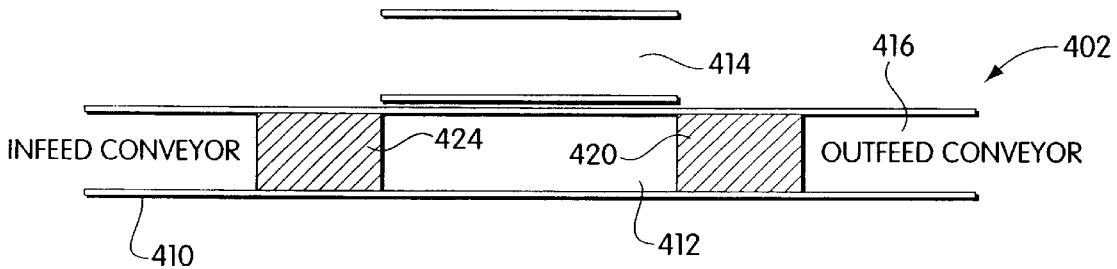

FIG. 6b shows the first circuit board 420 loaded in the middle of the front central conveyor. Once the first circuit board is loaded as shown in FIG. 6b, the central conveyors are moved forward to align the back central conveyor 414 with the infeed conveyor and the outfeed conveyor as shown in FIG. 6c. At the position shown in FIG. 6c, the first circuit board may be aligned, raised off of the conveyor if necessary, and the gantry system can position the dispensing pump over the first circuit board for dispensing of material onto the first circuit board. While dispensing is occurring on the first circuit board, a second circuit board can pass through the dispensing machine to a second dispensing machine using a path that includes the infeed conveyor 410, the back central conveyor 414 and the outfeed conveyor 416.

When dispensing is completed on the first circuit board, the front central conveyor is aligned with the infeed conveyor and the outfeed conveyor to allow the first circuit board to be moved out of the first dispensing machine, while a third circuit board 424 is moved into the first dispensing machine. The second dispensing machine may also be configured with the conveyor system 402. In this case, after dispensing is completed on the first circuit board, it can pass through the second dispensing machine while the second dispensing machine is dispensing material on the second circuit board.

Figure 7A:
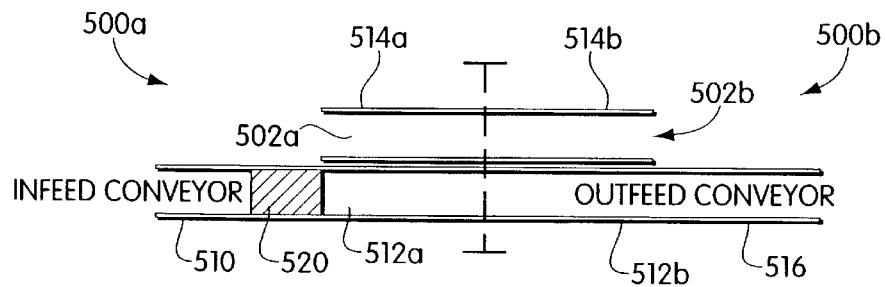
FIGS. 7a–7h are diagrams depicting the operation of a shuttle conveyor system in accordance with another embodiment of the present invention.

In one embodiment of the present invention, the conveyor system 402 is modified to create a conveyor system that is particularly useful with two dispensing machines coupled in series in a production line. The modified conveyor system will now be described with reference to FIGS. 7a–7h, which show the operation of two conveyor systems 502a and 502b, each of which is installed in a respective dispensing machine 500a and 500b. Except for the modified conveyor system, the dispensing machines 500a and 500b operate in a manner similar to dispensing machine 400. In FIG. 7a, the manufacturing process flow is from left to right and dispensing machine 500a is configured to be the first dispensing machine, and dispensing machine 500b is configured to be the second dispensing machine. However, as readily understood by those skilled in the art, the conveyor systems 502a and 502b are designed to be flexible so that each of the dispensing machines may be reconfigured to be an inlet or an outlet machine for a process flow in either direction.

Conveyor system 502a has an infeed conveyor 510, a front conveyor 512a and a back conveyor 514a. Conveyor system 502b has a front conveyor 512b, a back conveyor 514a and an outfeed conveyor 516. Dispensing machines 500a and 500b are designed to be placed in a production line adjacent each other without a board handling system disposed between the machines, so that boards can pass directly from conveyor system 502a to conveyor system 502b.

Figure 7B:
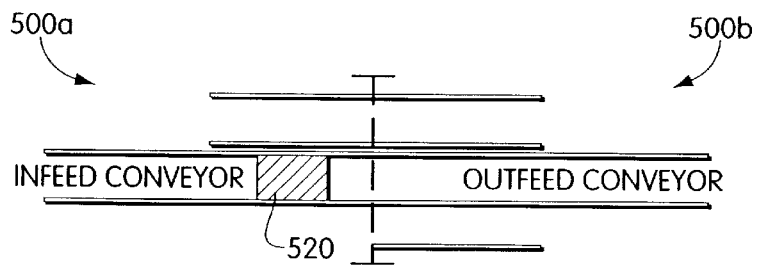

As shown in FIG. 7a, initially, a first circuit board 520 is loaded into dispensing machine 500a on infeed conveyor 510. In the initial step shown in FIG. 7a, the infeed conveyor 510 is aligned with the front conveyor 512a of conveyor system 502a, which in turn is aligned with the front conveyor 512b of conveyor system 502b. Conveyor system 502b is aligned with the outfeed conveyor 516. The first circuit board is moved from the infeed conveyor to the front conveyor 512a of conveyor 502a, as shown in FIG. 7b.

Figure 7C:
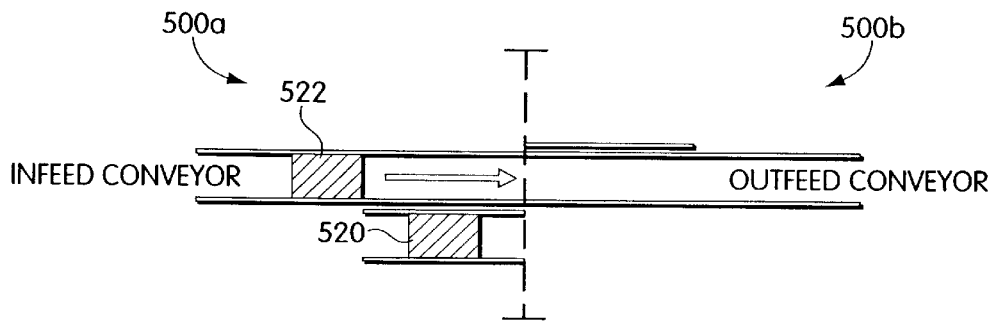
Figure 7D:
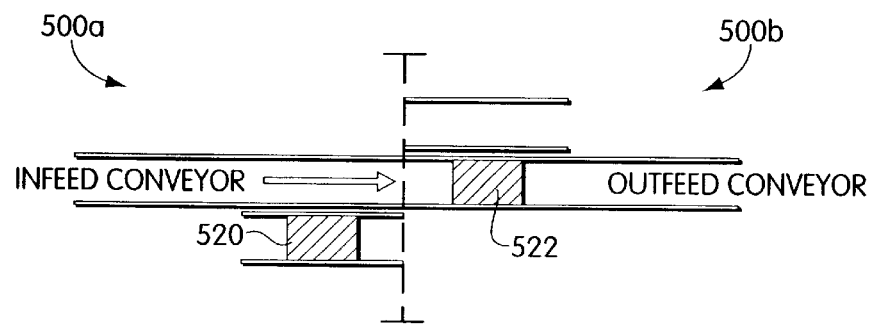

Front conveyor 512a and back conveyor 514a are then moved forward to align conveyor 514a with the infeed conveyor 510 and the front conveyor 512b of conveyor system 502b. As shown in FIGS. 7c and 7d, this allows a second circuit board 522 to be moved to the front conveyor 512a of conveyor system 502b. While the second circuit board is moved, dispensing can occur on the first circuit board 502a.

Figure 7E:
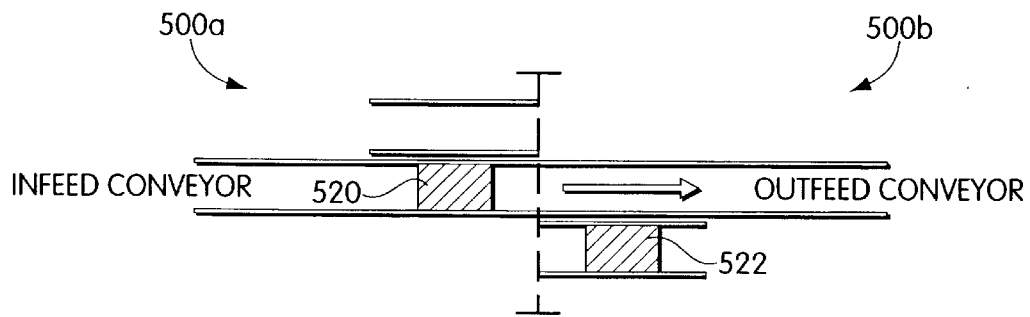
Figure 7F:
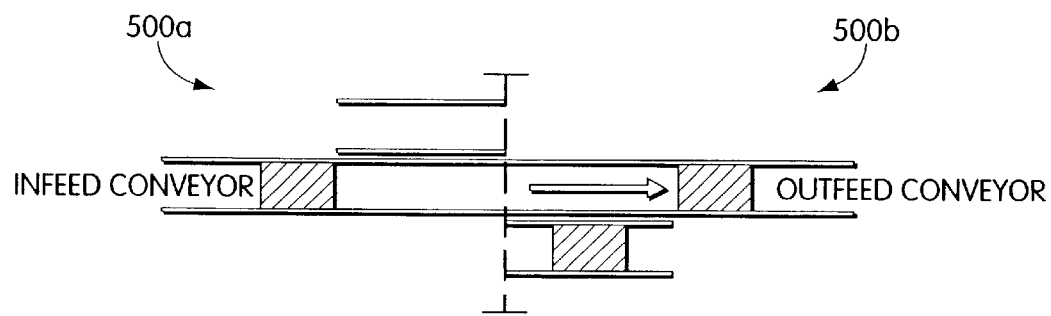
Figure 7G:
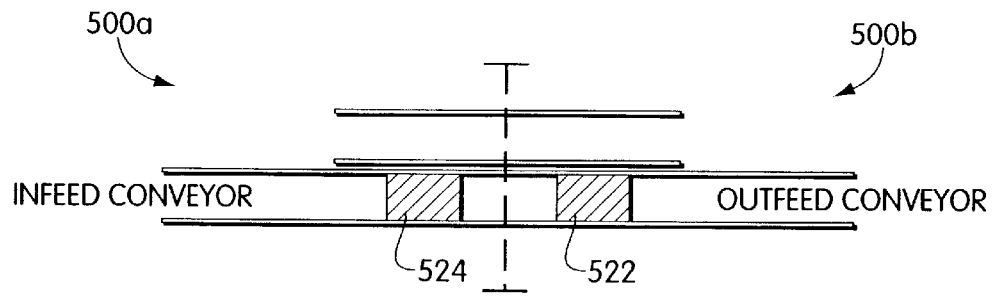
Figure 7H:
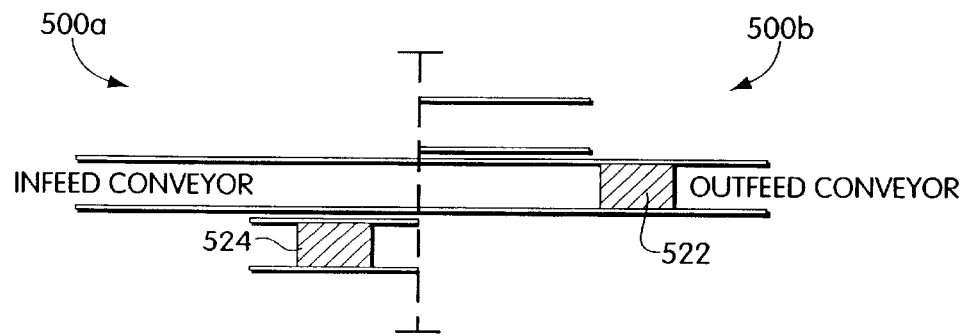

After dispensing occurs on the first circuit board, the front conveyor 512a and the back conveyor 514a of conveyor 502a are moved to the back position, and the front conveyor 512b and the back conveyor 514b of conveyor 502b are moved to the front as shown in FIG. 7e. The first circuit board can then pass through the second dispensing machine while dispensing occurs on the second circuit board. As the first circuit board is unloaded, a third circuit board 524 is loaded into the infeed conveyor as shown in FIG. 7f. As shown in FIGS. 7g and 7h, dispensing can then occur on the third circuit board as the second circuit board is unloaded from the second dispensing machine.

In another embodiment of the present invention, the dispensing system 400 described above is modified to produce a dual-zone dispensing system 700. Dispensing system 700 includes a conveyor system 702 that is similar to conveyor system 402. Conveyor system 702 has an infeed conveyor 710, a front central conveyor 712 a back central conveyor 714, and an outfeed conveyor 716. Parts of the conveyor system 702 are substantially identical to the parts of conveyor system 402, except that front central conveyor 712 and back central conveyor 714 are independently movable. The gantry system of dispensing system 700 is designed to allow dispensing of material while boards are disposed at either a front dispensing location 704 or a back dispensing location 706 as will now be described with reference to FIGS. 8a–8g.

Figure 8A:
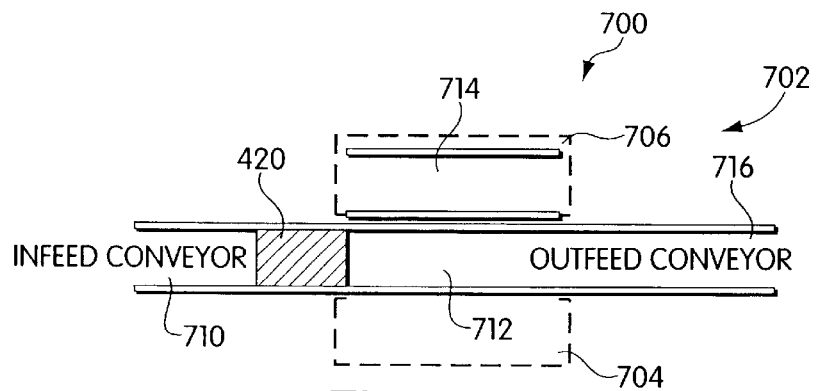
FIGS. 8a–8g are diagrams depicting the operation of the a shuttle conveyor system in accordance with another embodiment of the present invention.
Figure 8B:
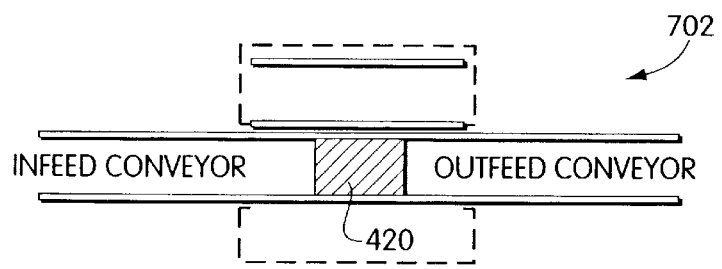
Figure 8C:
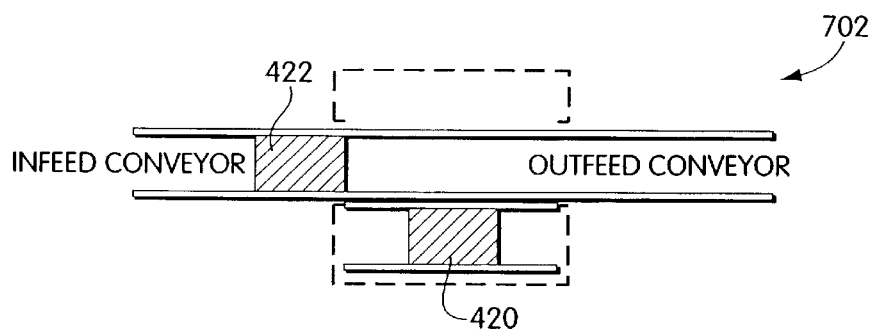
Figure 8D:
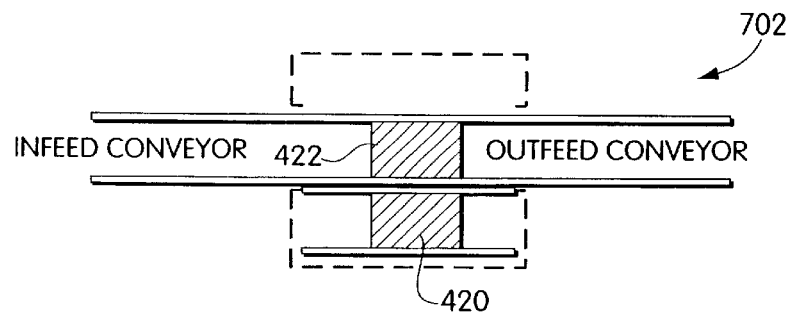

FIGS. 8a and 8b show conveyor system 702 disposed in the dispensing system 700 with a first board 420 being moved to the front center conveyor. Once the first board is loaded, the front center conveyor 712 and the back center conveyor 714 are moved forward to place the front conveyor with the board over the front dispensing location 704. Dispensing on the first circuit board occurs while a second circuit board 422 is loaded into the dispensing machine and moved to the back central conveyor 714 as shown in FIG. 8c and FIG. 8d.

Figure 8E:
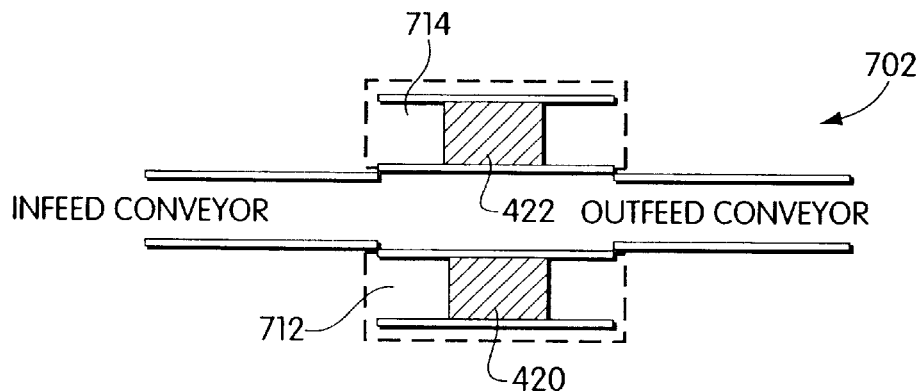
Figure 8F:
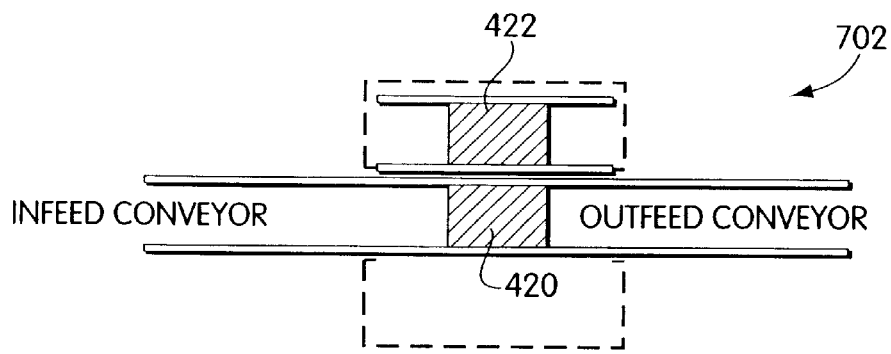
Figure 8G:
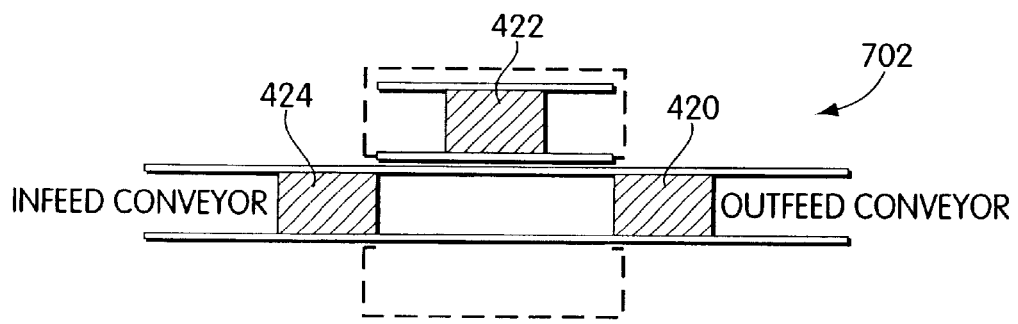

The back central conveyor 714 is then moved over the back dispensing location, as shown in FIG. 8e, to allow dispensing to occur on the second circuit board. Once dispensing is completed on the first circuit board, the dispensing pump is moved over the back dispensing location, and the front central conveyor is moved back to allow the first circuit board to be unloaded from the machine as shown in FIG. 8f and FIG. 8g. As the first circuit board is unloaded, a third circuit board 726 may be loaded into the dispensing machine to repeat the process.

As described above, the dispensing machine 700 has an extended gantry system that allows a single pump to dispense material on circuit boards at two different dispensing locations. Further dispensing machines have platforms that have sufficient depth to accommodate both dispensing locations, while still providing room between the two locations for the transport of circuit boards through the machine. As understood by those skilled in the art, in other embodiments, a second gantry system and second dispensing pump could be included in the dispensing machine to permit dispensing on circuit boards at both locations. Further, as understood by those skilled in the art, conveyor system 702 is a flexible system that can be operated in a number of ways in addition to the operation described above with reference to FIGS. 8a–8g.

The conveying systems of embodiments of the present invention have been described for use with a dispensing machine. As understood by those skilled in the art, the conveying systems may also be used with other machines, such as those included in the production lines of the present invention.

In embodiments of the present invention described above, production lines are shown as being oriented in a line along a straight axis. In other embodiments, the axis of the production line may bend to accommodate features of a manufacturing facility.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting.

What is claimed is:

1. A production system for producing completed circuit boards from raw circuit boards, the production system comprising:

a first production line having an input to receive raw circuit boards and an output that provides completed circuit boards, the first production line including a plurality of machines, coupled in series and arranged substantially along a first axis, each of the machines performing an operation on the raw circuit boards;

a second production line having an input to receive raw circuit boards and an output that provides completed circuit boards, the second production line including a plurality of machines, coupled in series and arranged along a second axis that is substantially parallel to the first axis, each of the machines performing an operation on the raw circuit boards;

a set of spare machines disposed along a third axis that is substantially parallel to the first axis and the second axis, the third axis being disposed between the first axis and the second axis, wherein each machine of the spare machines is similar to, and may function as a replacement for, at least one of the machines in the first production line and is similar to, and may function as a replacement for, one of the machines of the second production line, wherein each of the first production line, the second production line and the set of spare machines is constructed and arranged to provide for replacement of a machine from one of the first production line and the second production line with a machine from the set of spare machines without substantial interruption in production of circuit boards.

2. The production system of claim 1, wherein the set of spare machines is configured as a third production line having an input to receive raw circuit boards and an output that provides completed circuit boards.

3. The production system of claim 2, wherein the first production line includes a first printer, a second printer and a transfer station, each of the first printer and the second printer having an input to receive circuit boards and an output to provide circuit boards having solder paste disposed thereon, the transfer station having a first input coupled to the output of the first printer, a second input coupled to the output of the second printer, and an output that provides circuit boards received from the first printer and the second printer.

4. The production system of claim 3, wherein at least the first production line includes a first dispensing machine having an input, an output, and a shuttle conveyor system, and wherein the shuttle conveyor system includes movable conveyor segments that allow a second circuit board to be moved from the input of the first dispensing machine to the output of the first dispensing machine while material is dispensed on a first circuit board in the first dispensing machine.

5. The production system of claim 4, wherein at least the first production system includes a second dispensing machine disposed after the first dispensing machine in the first production system, the second dispensing machine having an input, an output, and a shuttle conveyor system, and wherein the shuttle conveyor system includes movable segments that allow the first circuit board to be moved from the input of the second dispensing machine to the output of the second dispensing machine while material is dispensed on the second circuit board in the second dispensing machine.

6. The production system of claim 1, wherein the first production line includes a first printer, a second printer and a transfer station, each of the first printer and the second printer having an input to receive circuit boards and an output to provide circuit boards having solder paste disposed thereon, the transfer station having a first input coupled to the output of the first printer, a second input coupled to the output of the second printer, and an output that provides circuit boards received from the first printer and the second printer.

7. The production system of claim 1, wherein at least the first production line includes a first dispensing machine having an input, an output, and a shuttle conveyor system, and wherein the shuttle conveyor system includes movable conveyor segments that allow a second circuit board to be moved from the input of the first dispensing machine to the output of the first dispensing machine while material is dispensed on a first circuit board in the first dispensing machine.

8. The production system of claim 7, wherein at least the first production system includes a second dispensing machine disposed after the first dispensing machine in the first production system, the second dispensing machine having an input, an output, and a shuttle conveyor system, and wherein the shuttle conveyor system includes movable segments that allow the first circuit board to be moved from the input of the second dispensing machine to the output of the second dispensing machine while material is dispensed on the second circuit board in the second dispensing machine.

\* \* \* \* \*